United States Patent [19]
Hedberg et al.

[11] Patent Number: 5,371,480
[45] Date of Patent: Dec. 6, 1994

[54] STEP CONTROLLED SIGNAL GENERATOR

[75] Inventors: Bo Hedberg, Kista; Peter Petersson, Jarfalla, both of Sweden

[73] Assignee: Telefonaktiebolaget L M Ericsson, Stockholm, Sweden

[21] Appl. No.: 985,965

[22] Filed: Dec. 4, 1992

[51] Int. Cl.⁵ .................... H03L 7/093; H03L 7/18
[52] U.S. Cl. ...................... 331/16; 331/17; 331/18
[58] Field of Search ............ 331/4, 15, 16, 17, 18; 435/165.1, 183.1, 192.2, 260

[56] References Cited

U.S. PATENT DOCUMENTS

| | | | |
|---|---|---|---|
| 3,740,671 | 6/1973 | Crow et al. | 333/70 R |
| 4,568,888 | 2/1986 | Kimura et al. | 331/16 X |
| 4,603,305 | 7/1986 | McCune | 331/4 |
| 4,614,917 | 9/1986 | Zelitzki et al. | 331/4 X |
| 4,672,632 | 6/1987 | Andersen | 375/57 |
| 4,728,906 | 3/1988 | Turi et al. | 331/4 |
| 4,745,371 | 5/1988 | Haine . | |
| 4,771,250 | 9/1988 | Statman et al. | 331/17 |
| 4,885,553 | 12/1989 | Hietala et al. | 331/17 |
| 5,055,803 | 10/1991 | Hietala | 331/17 |
| 5,068,625 | 11/1992 | Baker et al. | 331/1 A |
| 5,140,284 | 8/1992 | Petersson et al. . | |

FOREIGN PATENT DOCUMENTS 315489 5/1989 European Pat. Off. .

Primary Examiner—David Mis
Attorney, Agent, or Firm—Burns, Doane, Swecker & Mathis

[57] ABSTRACT

A phase locked loop frequency synthesizer in which the output frequency is changed in a series of steps in order to reach a final frequency value. The steps are computed and stored in a memory in a control unit. The steps are chosen to approximately cancel the poles of the transfer function of the synthesizer. The phase locked loop provides increased switching speed.

29 Claims, 4 Drawing Sheets

STEP CONTROLLED SIGNAL GENERATOR

FIELD OF THE INVENTION

The present invention relates to frequency synthesizers of the type having a phase locked loop (PLL), and more particularly, to an improved frequency synthesizer which can quickly switch frequencies while maintaining suppression of disturbances.

BACKGROUND OF THE INVENTION

A phase locked loop is a well known circuit which typically includes a phase detector, a filter, and a voltage controlled oscillator (VCO). A stable input signal or reference signal is applied to the phase detector which compares the input signal to the output of the voltage controlled oscillator. The output signal of the phase detector is representative of the phase difference between the input signal and the output signal of the voltage controlled oscillator. The output signal of the phase detector is filtered. The filtered signal is then used as an error signal to control the voltage controlled oscillator, thereby causing the frequency of the voltage controlled oscillator to track the frequency of the stable input signal.

It is well known to those skilled in the art to generate different signals having a carefully determined frequency $f_{vco}$ using a frequency synthesizer having a PLL 10 as illustrated in FIG. 1. The PLL 10 includes a controllable oscillator VCO 14 which is locked to a crystal source which provides an input signal $f_{xtal}$. The frequency of the VCO signal $f_{vco}$ is typically divided by a controllable divider 15 having a division number N to obtain a signal having a frequency $f_v$. The signal $f_v$ is thereafter compared to the reference signal $f_{ref}$ which is derived from the division of the input signal $f_{xtal}$ from the crystal frequency source by a frequency divider 11 having a division number R. The comparison of the signals having frequencies $f_{ref}$ and $f_v$ in the phase detector 12 generates the control or error signal E. The control signal E is filtered by the filter 13 in order to remove signal components emanating from the signals $f_{ref}$ and $f_v$ respectively. The filtered signal U controls the VCO 14 so that a balanced condition is reached ($f_{vco} = f_{xtal} \times N \div R$). By choosing different division numbers, N and R respectively, different frequencies can be achieved with a relatively high degree of accuracy.

In this type of frequency synthesizer, the frequency can be changed by selecting the division numbers R and N. After a new frequency has been selected, a certain time is required to achieve a balanced condition. The amount of time is usually dependent upon the filter 13. In many implementations, it is necessary to quickly achieve a stable output signal $f_{vco}$. Accordingly, the filter 13 has to be designed to have a relatively broad bandwidth.

The bandwidth of the filter 13 in relation to the reference frequency $f_{ref}$ also determines how large a disturbance from $f_{ref}$ and $f_v$ will leak through to the VCO 14. Consequently, the filter 13 and the reference frequency $f_{ref}$ determine the level of disturbances in the VCO output signal $f_{vco}$. The smallest channel spacing needs to be equal to or larger than the reference frequency $f_{ref}$. The requirements for a pure signal, therefore, are in conflict with the requirements for a relatively quick locked-in and relatively tight channel spacing.

In order to solve this conflict, a known solution is to switch the bandwidth of the phase locked loop during the locked-in process. As soon as the phase locked loop acquires a locked condition, or a small phase error is attained, the bandwidth is changed from a relatively broad value to a narrow one. The above-described method, however, has certain drawbacks. The switching instant has to be decided, and equipment to make such a decision and the switching itself as well as switchable loop filter have to be implemented. Other methods are also known, e.g., presetting the voltage in the filter controlling the VCO. Most of these methods result in extra components which are needed to speed up the phase locked loop locked-in process and to keep the loop narrow during the locked state. Accordingly, there is a need for a new phase locked loop which can achieve quick locked-in combined with a low disturbance level without adding a lot of extra components to the system.

Another problem with conventional frequency synthesizers is that components of the frequency synthesizer may need to be trimmed. Since some parameters of a phase locked loop are not always accurately known, the transfer function of the frequency synthesizer is difficult to accurately predict. As a result, components of the phase locked loop, like capacitors, may need to be trimmed, which can be an expensive procedure, in order to optimalize the performance of the frequency synthesizer. Accordingly, there is a need for a frequency synthesizer which does not need to be trimmed in order to obtain optimal performance.

SUMMARY OF THE DISCLOSURE

The present invention provides a frequency synthesizer of a phase locked loop type which changes frequencies at a fast rate. The synthesizer has a narrow bandwidth, thus a low level of disturbances. The synthesizer also may have tight channel spacing. The synthesizer has apparently no extra components, but uses the method known as pull zero cancellation. The present invention changes the frequency of the phase locked loop in such a way that one or more poles of the closed loop transfer function will be cancelled by zeros introduced by the frequency change. Thus, in contrast with PLL synthesizers designed according to the state of the art, the new phase locked loop optimization includes not only the phase locked loop itself, but also the way in which it is switched. Because the switching capability is inherent in almost every synthesizer, few components may will be needed to implement the present invention.

In the present invention, instead of just switching from one frequency to another, the synthesizer is switched to the new desired frequency in steps. The steps of the switching function can be computed and/or stored in a memory in a controller unit. A phase locked loop with a fairly narrow loop band width can therefore be settled to approximately the desired frequency within a limited time. While the phase locked loop settles rapidly to the new frequency, a small remaining phase or frequency error is possible . However, the small error will exponentially decay. In conventional frequency synthesizers, the locked-in process proceeds along an exponential asymptotic decaying frequency error which starts with an error equal to the entire frequency shift.

In another embodiment, the present invention discloses a frequency synthesizer in which the components of the phase locked loop do not need to be trimmed in order to provide optimal performance. In the present invention, the frequency of the frequency synthesizer is first switched in the conventional manner, i.e., in one step. The response of the phase locked loop is then measured from which the steps of the switching function are computed. As a result, the performance of the frequency synthesizer can be optimized without trimming the hardware of the phase locked loop.

BRIEF DESCRIPTION OF THE DRAWINGS

These and other features and advantages of the present invention will be readily apparent to one of ordinary skill in the art from the following written description read in conjunction with the drawings, in which.

DESCRIPTION OF THE PREFERRED EMBODIMENTS

Figure 1:
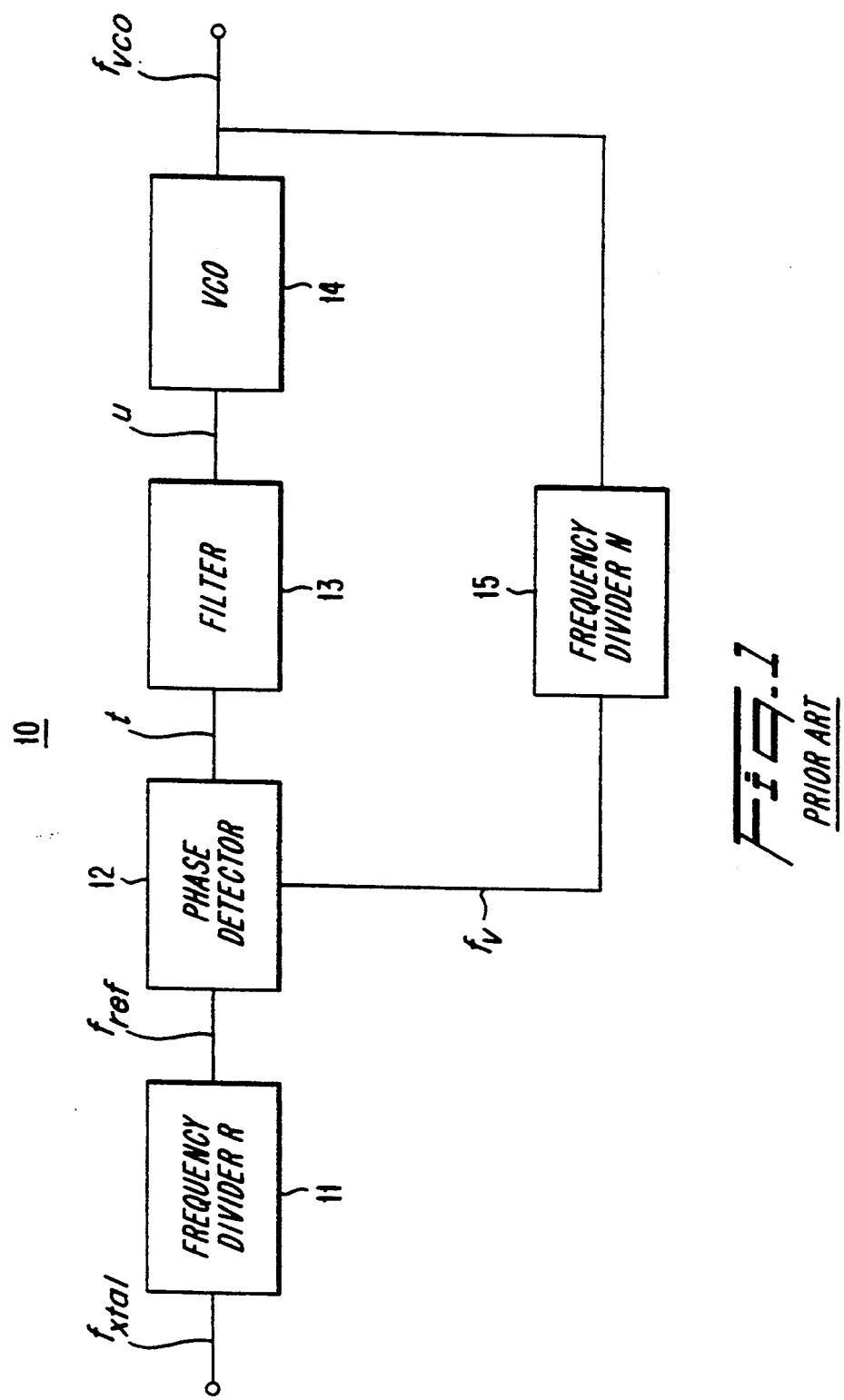
FIG. 1 is a blocked diagram of a prior art phase locked loop frequency synthesizer.
Figure 2:
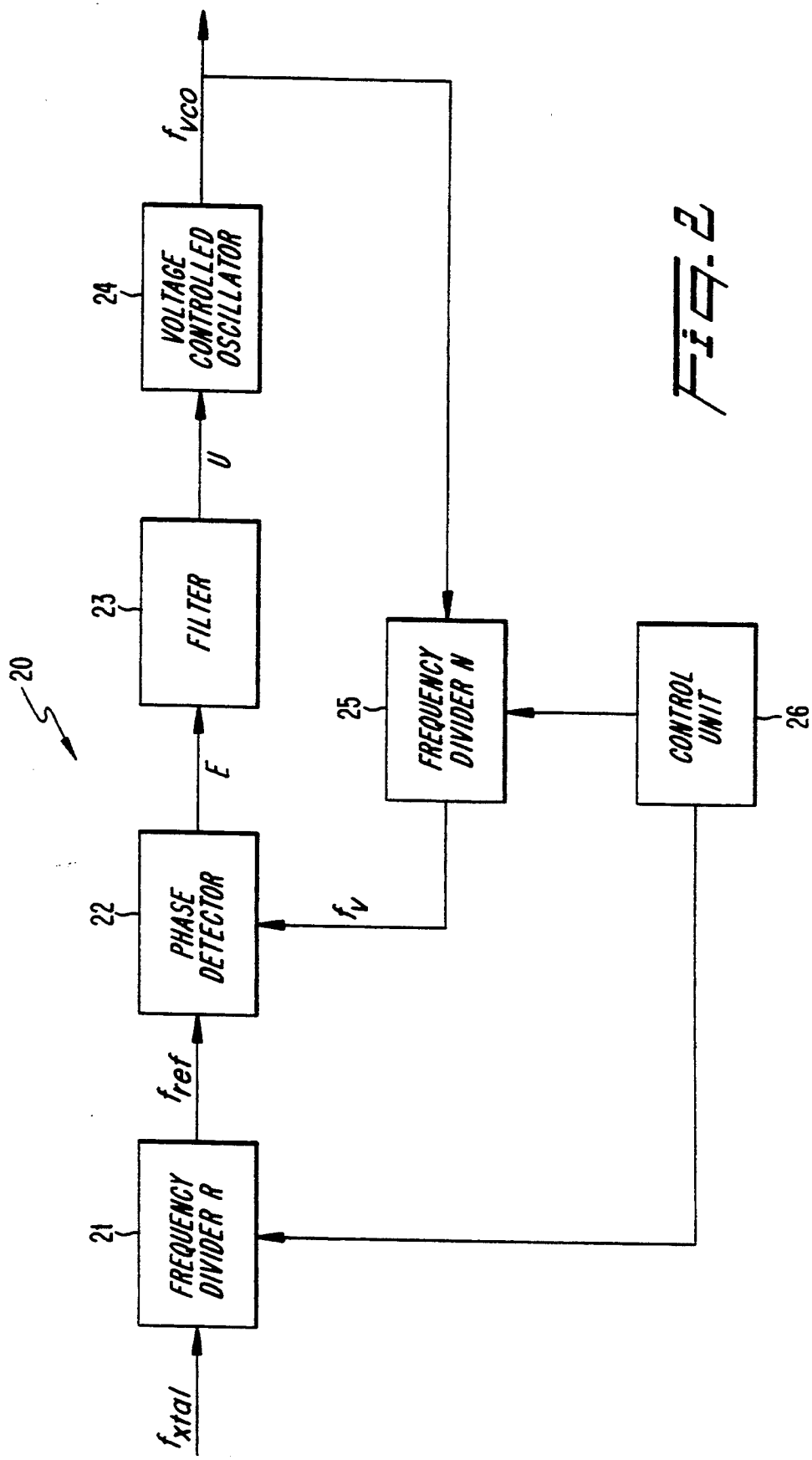
FIG. 2 is a blocked diagram of a phase locked loop frequency synthesizer of one embodiment of the present invention.

Referring now to FIG. 2, a blocked diagram illustrates the frequency synthesizer 20 of one embodiment of the present invention. The frequency synthesizer 20 is responsive to an input signal $f_{xtal}$ which is generated by a crystal oscillator or other suitable frequency source. The signal $f_{xtal}$ is applied to a frequency divider 21 which divides the signal by a division number R to provide a suitable reference signal $f_{ref}$. The suitable reference signal $f_{ref}$ is applied to a phase detector 22. The phase detector 22 compares the frequency of the reference signal $f_{ref}$ with the frequency of a signal outputted by a second frequency divider 25, which is described below. The phase detector 22 generates an error signal E which is outputted to a filter 23. The output of the phase detector 22 is filtered by the filter 23 and applied to a VCO 24 to generate a signal $f_{vco}$. The signal $f_{vco}$ is then applied to a frequency divider 25 which divides the signal by a division number N to generate a signal $f_y$. The signal $f_y$ is applied to the phase detector 22 where it is compared to the signal $f_{ref}$. The output of the phase detector 22 is an error signal E which is representative of the phase difference between the signals $f_{ref}$ and $f_y$. The error signal E is filtered to provide the filter signal U used to control the VCO 24. In the present invention, the synthesizer is switched from one frequency to another frequency by a series of steps. The steps are computed and stored in control unit 26.

In the preferred embodiment of the present invention, the phase locked loop frequency synthesizer is one in which all dominant poles of the transfer or error function of the closed loop are at the same value and do not contain any imaginary parts. However, the present invention is not restricted to phase locked loop transfer functions with only pure real poles. Complex poles give a benefit of fewer steps in the input control function but require independent frequency step time and amplitude values. The frequency changes from one channel to another require as many steps as there are poles to be cancelled. Thus, for example, a third-order phase locked loop synthesizer will need four steps to change the frequency from the present frequency to a desired frequency. The steps are made with an amplitude and durability which corresponds to the zeros that have to match the poles in the error or transfer function of the phase locked loop. After the last step is performed, the frequency or phase error is approximately zero.

Figure 3:
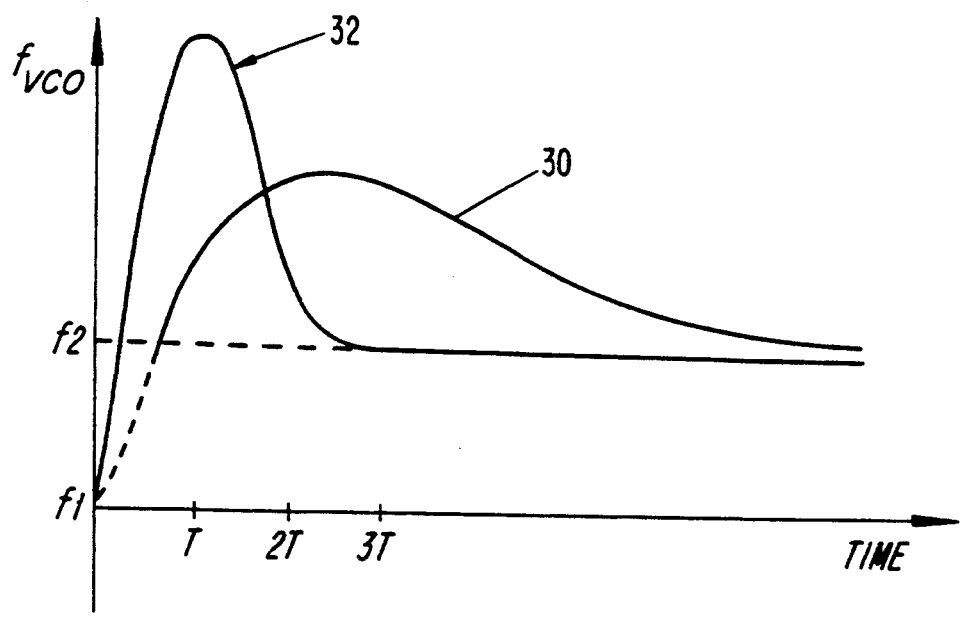
FIG. 3 is a diagram of the output frequency as a function of time for a synthesizer of the prior art compared to one according to the present invention.

An example of the above described process is disclosed below. FIG. 3 illustrates the settling time for a prior art frequency synthesizer and a frequency synthesizer of the present invention. In this example, the frequency of a third order phase locked loop synthesizer is changed from frequency f1 to frequency f2. In the prior art phase locked loop synthesizer, only one step is performed to change the frequency from frequency f1 to frequency f2.

Figure 4:
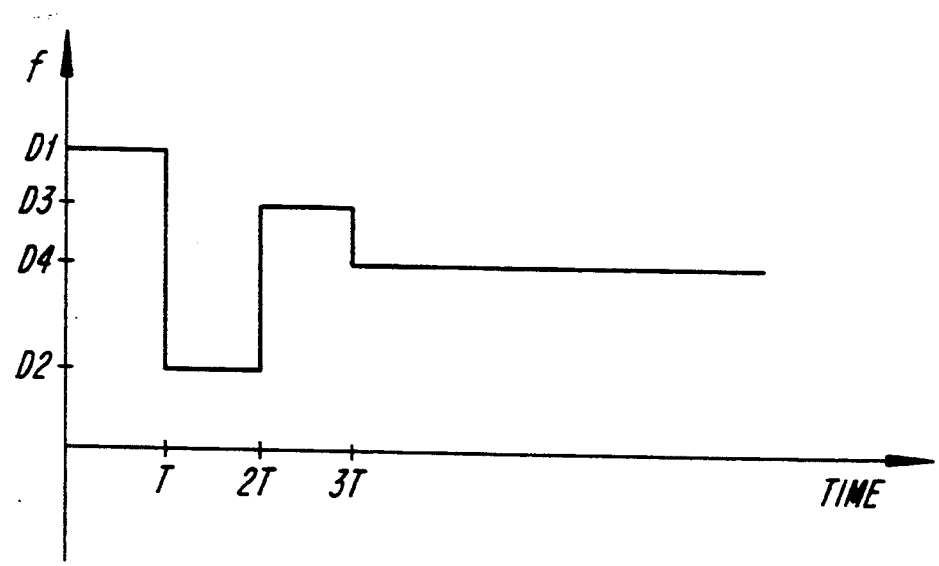
FIG. 4 is a diagram of the controlled input frequency function versus time according to the present invention and the prior art.

However, in a phase locked loop according to the present invention, the change in frequency will be made in four steps, D1, D2, D3, and D4 as visualized in FIG. 4. If the amplitudes are chosen as:

$$D1 = D4/(1-a)^3$$

$$D2 = D4(1-3a)/(1-a)^3$$

$$D3 = D4(1-3a+3a^2)/(1-a)^3$$

$$D4 = f2 - f1$$

where $a = 1/e$ and $e =$ the base of the natural log, the frequency change function can then be interpreted as:

$$D4 = (1 - ae^{-sT})^3/s(1-a)^3 \qquad \text{(eq. 1)}$$

where $s =$ Laplace operator, $t =$ the duration of the individual input frequency steps. This function is the input of the phase locked loop, whose transfer function is:

$$3c^3(s+c/3)/(s+c^3) \qquad \text{(eq. 2)}$$

The poles which have to be cancelled are at $s = -c$ where $c =$ the pole frequency. In this example, we used $T = 1/c$. The behavior of the phase locked loop derived from equation 1 when multiplied by equation 2 gives $f_{vco} = D4 + f1$ after a limited time which is equal to 3T. The method of zero pole cancellation can naturally be implemented in many ways, e.g., changing $f_{vco}$ by means of either changing the dividing ratio in the reference divider, R, and/or in the divider N. The settling time for the frequency synthesizer of the present invention is illustrated in FIG. 3 as the curve 32. As can be seen by comparing the curve 32 with the curve 30, the frequency of the synthesizer stabilizes much faster to the desired frequency when the frequency change is made in a series of steps rather than in one step.

Figure 5:
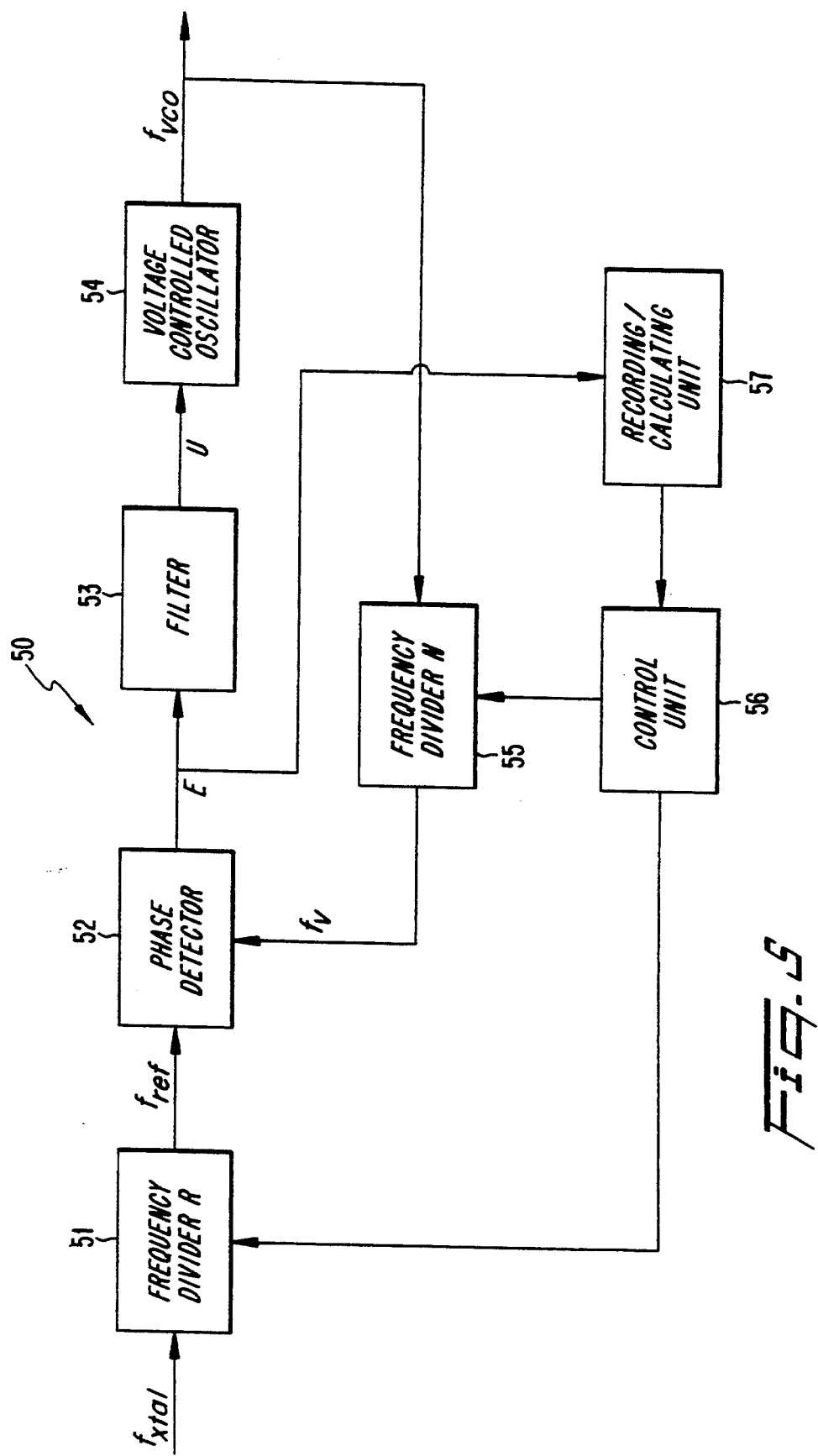
FIG. 5 is a blocked diagram of a phase locked loop frequency synthesizer of another embodiment of the present invention.

Referring now to FIG. 5, a blocked diagram illustrates a frequency synthesizer of another embodiment of the present invention. In this embodiment of the present invention, the settling time of the frequency synthesizer can be optimized without trimming the components of the phase locked loop. In order to take full advantage of the present invention, the series of steps of the switching function need to be properly dimensioned to match the transfer function of the frequency synthesizer. In this embodiment, the frequency of the frequency synthesizer 50 is first switched to a desired frequency in one step and the steps of the switching function are then computed.

The operation of the frequency synthesizer 50 will now be explained. The frequency synthesizer 50 is responsive to an input signal $f_{xtal}$ which is generated by a crystal oscillator or other suitable frequency source. The signal $f_{xtal}$ is applied to a frequency divider 51 which divides the signal by a division number R to provide a suitable reference signal $f_{ref}$. The suitable reference signal $f_{ref}$ is applied to a phase detector 52. The phase detector 52 compares the frequency of the reference signal $f_{ref}$ with the frequency of a signal outputted by a second frequency divider 55, which is described below. The phase detector 52 generates an error signal E which is outputted to a filter 53. The output of the phase detector 52 is filtered by the filter 53 and applied to a VCO 54 to generate a signal $f_{vco}$. The signal $f_{vco}$ is then applied to a frequency divider 55 which divides the signal by a division number N to generate a signal $f_v$. The signal $f_v$ is applied to the phase detector 52 where it is compared to the signal $f_{ref}$. The output of the phase detector 52 is an error signal E which is representative of the phase difference between the signals $f_{ref}$ and $f_v$. The error signal E is filtered to provide the filter signal U used to control the VCO 54. In the present embodiment, the error signal E is sent to a recording-/calculating unit 57 where it is stored. In an alternative embodiment, the error signal E is sent to the control unit 56 where it is recorded.

In the present embodiment, the response of the frequency synthesizer 50 is measured when the frequency of the frequency synthesizer 50 is switched to a desired frequency in one step. When the frequency is changed, the phase error is detected by the phase detector 52 and the error signal or the stepresponse is recorded in the recording/calculating unit 57. The optimal series of frequency steps can then be calculated in the recording-/calculating unit 57 from the recorded data by using one of several known methods. For example, the frequency steps can be calculated by using the Duhamel Superposition Integral which describes the input-output relationship for a system where the stepresponse is used to characterize the system behavior. In the alternative, the Fast Fourier Transform method can be used to calculate the frequency steps. The constants of the resulting transfer function of the phase locked loop can then be determined by well known curve fitting methods to best suit the recorded phase error. Finally, the calculated steps are stored in the control unit 56 where they can be recalled for further use.

While the invention has been described in its preferred embodiments, it is to be understood that the words that have been used are words of description rather than of limitation and that changes within the purview of the appended claims may be made without departing from the true scope and spirit of the invention in its broader aspects.

What is claimed is:

1. A signal generator having a selectable output frequency which is locked to a reference signal using a phase locked loop, comprising:
   a first frequency divider means for producing the reference signal;
   a phase detector means for generating an error signal from the reference signal and a second signal;
   a filter means for filtering the error signal to remove signal components from the error signal;
   a voltage controlled oscillator means for generating a output signal from said filtered error signal;
   a second frequency divider means for dividing the output signal of the oscillator to produce the second signal; and
   means for changing the output frequency of said signal generator in control steps to quickly get a selected output frequency, wherein the control steps for changing the output frequency have a duration and amplitude that approximately cancel at least one pole in a transfer function of the signal generator.

2. A signal generator according to claim 1, wherein the selectable output frequency is locked to the referenced signal using a frequency locked loop.

3. A signal generator according to claim 1, wherein pole-zero cancellation is used to cancel at least one pole in the transfer function of the generator.

4. A signal generator according to claim 1, wherein the output signal is changed by varying a dividing ratio in the first frequency divider.

5. A signal generator according to claim 1, wherein the output signal is changed by varying a dividing ratio in the second frequency divider.

6. A signal generator according to claim 1, wherein at least one pole of the transfer function is cancelled by zeros introduced by the frequency change.

7. A signal generator according to claim 1, wherein the steps for changing the output frequency are computed in a control unit.

8. A signal generator according to claim 1, wherein the steps for changing the output frequency are stored in a control unit.

9. A signal generator according to claim 1, wherein the number of steps for changing the output frequency equals the number of poles in a transfer function of the signal generator.

10. A frequency synthesizer, comprising:
    a first frequency dividing means for dividing an input signal by a first division number to produce a reference signal;
    a phase detecting means for generating an error signal from said reference signal and a second signal;
    a filtering means for filtering the error signal to remove signal components from the error signal;
    a voltage controlled oscillating means for generating an output signal from the filtered error signal;
    a second frequency dividing means for dividing the output signal by a second division number to produce the second signal; and
    a control means for changing the output frequency in control steps to produce a selected output frequency, wherein the control steps for changing the output frequency have a duration and amplitude that approximately cancel at least one pole in a transfer function of the frequency synthesizer.

11. A frequency synthesizer according to claim 10, wherein pole zero cancellation is used to cancel at least one pole in the transfer function of the frequency synthesizer.

12. A frequency synthesizer according to claim 10, wherein the output frequency is changed by varying a dividing ratio in the first frequency dividing means.

13. A frequency synthesizer according to claim 10, wherein the output frequency is changed by varying a dividing ratio in the second frequency dividing means.

14. A frequency synthesizer according to claim 10, wherein at least one pole of a transfer function of said synthesizer is cancelled by zeros introduced by the frequency change.

15. A frequency synthesizer according to claim 10, wherein the steps for changing the output frequency are computed in said control unit.

16. A frequency synthesizer according to claim 10, wherein the steps for changing the output frequency are stored in said control unit.

17. A frequency synthesizer according to claim 10, wherein the number of steps for changing the output frequency equals the number of poles in a transfer function of the synthesizer.

18. A signal generator having a selectable output frequency which is locked to a reference signal using a phase locked loop, comprising:
   a first frequency divider means for producing the reference signal;
   a phase detector means for generating an error signal form the reference signal and a second signal;
   a filter means for filtering the error signal to remove signal components from the error signal;
   a voltage controlled oscillator means for generating an output signal from the filtered error signal;
   a second frequency divider means for dividing the output signal of the oscillator to produce a second signal;
   a first means for recording an error signal detected by said phase detector when the output frequency of said signal generator is changed to a desired frequency in one step and for calculating a series of steps for a switching function from said recorded signal;
   storing means for storing said steps of said switching function; and
   a control means for changing the output frequency of said signal generator to said desired frequency by switching the frequency in said series of steps.

19. A signal generator according to claim 18, wherein the selectable output frequency is locked to the reference signal using a frequency locked loop.

20. A signal generator according to claim 18, wherein the steps for changing the output frequency have a duration and amplitude that approximately cancel at least one pole in a transfer function of the signal generator.

21. A signal generator according to claim 18, wherein pole-zero cancellation is used to cancel at least one pole in the transfer function of the generator.

22. A signal generator according to claim 18, wherein the output signal is changed by varying a dividing ratio in the first frequency divider.

23. A signal generator according to claim 18, wherein the output signal is changed by varying a dividing ratio in the second frequency divider.

24. A signal generator according to claim 20, wherein at least one pole of the transfer function is cancelled by zeros introduced by the frequency change.

25. A signal generator according to claim 18, wherein the steps for changing the output frequency are calculated in a control unit.

26. A signal generator according to claim 18, wherein the steps for changing the output frequency are stored in a control unit.

27. A signal generator according to claim 18, wherein the number of steps for changing the output frequency equals the number of poles in a transfer function of the signal generator.

28. A signal generator according to claim 18, wherein said steps of said switching function are calculated using the Duhamel Superposition Integral.

29. A signal generator according to claim 18, wherein said steps of said switching function are calculated using the Fast Fourier Transform method.

* * * * *